United States Patent
Hao et al.

(10) Patent No.: US 11,929,429 B2
(45) Date of Patent: Mar. 12, 2024

(54) NITRIDE-BASED SEMICONDUCTOR DEVICE AND METHOD FOR MANUFACTURING THE SAME

(71) Applicant: INNOSCIENCE (SUZHOU) TECHNOLOGY CO., LTD., Suzhou (CN)

(72) Inventors: Ronghui Hao, Suzhou (CN); Fu Chen, Suzhou (CN); King Yuen Wong, Suzhou (CN)

(73) Assignee: INNOSCIENCE (SUZHOU) TECHNOLOGY CO., LTD., Suzhou (CN)

( * ) Notice: Subject to any disclaimer, the term of this patent is extended or adjusted under 35 U.S.C. 154(b) by 429 days.

(21) Appl. No.: 17/433,623

(22) PCT Filed: Jun. 2, 2021

(86) PCT No.: PCT/CN2021/097891
§ 371 (c)(1),
(2) Date: Aug. 25, 2021

(87) PCT Pub. No.: WO2022/252146
PCT Pub. Date: Dec. 8, 2022

(65) Prior Publication Data
US 2022/0393024 A1    Dec. 8, 2022

(51) Int. Cl.
*H01L 29/20* (2006.01)
*H01L 29/40* (2006.01)
(Continued)

(52) U.S. Cl.
CPC ...... *H01L 29/7786* (2013.01); *H01L 29/2003* (2013.01); *H01L 29/402* (2013.01); *H01L 29/66431* (2013.01)

(58) Field of Classification Search
CPC ............ H01L 29/1066; H01L 29/2003; H01L 29/402; H01L 29/66431; H01L 29/7786
See application file for complete search history.

(56) References Cited

U.S. PATENT DOCUMENTS 10,068,974 B2    9/2018  Li et al.
11,302,778 B2 *  4/2022  Wong .................. H01L 29/7787
(Continued)

FOREIGN PATENT DOCUMENTS

CN        104332498 A      2/2015
CN        204792797 U     11/2015
(Continued)

OTHER PUBLICATIONS

Second Office Action of corresponding China patent application No. 202180001630.9 dated Sep. 15, 2022.
(Continued)

*Primary Examiner* — Jaehwan Oh
(74) *Attorney, Agent, or Firm* — JCIPRNET

(57) ABSTRACT

A nitride-based semiconductor device includes a first nitride-based semiconductor layer, a second nitride-based semiconductor layer, a source electrode, a drain electrode, a gate electrode and a single field plate. The source electrode, the drain electrode, and the gate electrode are disposed on the second nitride-based semiconductor layer. The gate electrode is between the source and drain electrodes. The single field plate is disposed over the gate electrode and extends toward the drain electrode. The field plate has a first end part, a second end part and the central part. The first and the second end parts are located at substantially the same height. Portions of the central part are in a position lower than that of the first and second end parts, and the first end part extends laterally in a length greater than a width of the gate electrode.

20 Claims, 12 Drawing Sheets

(51) Int. Cl.
*H01L 29/66* (2006.01)
*H01L 29/778* (2006.01)

(56) References Cited

U.S. PATENT DOCUMENTS

| | | |
|---|---|---|
| 11,398,546 B2 * | 7/2022 | Wu .................... H01L 29/0657 |
| 2012/0267637 A1 | 10/2012 | Jeon et al. |
| 2014/0061659 A1 | 3/2014 | Teplik et al. |
| 2014/0264431 A1 | 9/2014 | Lal |
| 2015/0357422 A1 * | 12/2015 | Liao .................... H01L 23/3171 |
| | | 438/172 |
| 2016/0079406 A1 | 3/2016 | Oasa et al. |
| 2017/0033191 A1 | 2/2017 | Meiser et al. |
| 2017/0125572 A1 | 5/2017 | Curatola et al. |
| 2020/0373420 A1 | 11/2020 | Chou et al. |

FOREIGN PATENT DOCUMENTS

| | | |
|---|---|---|
| CN | 105247681 A | 1/2016 |
| CN | 206412319 U | 8/2017 |
| CN | 107452625 A | 12/2017 |
| CN | 110690275 A | 1/2020 |
| CN | 111834436 A | 10/2020 |

OTHER PUBLICATIONS

International Search Report and Written Opinion of the corresponding PCT application No. PCT/CN2021/097891 dated Feb. 24, 2022.
Notice of Allowance of corresponding China patent application No. 202180001630.9 dated Dec. 12, 2022.
First Office Action of the corresponding China patent application No. 202180001630.9 dated Jul. 7, 2022.

* cited by examiner

NITRIDE-BASED SEMICONDUCTOR DEVICE AND METHOD FOR MANUFACTURING THE SAME

FIELD OF THE INVENTION

The present invention generally relates to a nitride-based semiconductor device. More specifically, the present invention relates to a III-nitride-based semiconductor device with a single field plate, thereby simplifying the manufacturing process and reducing the production costs.

BACKGROUND OF THE INVENTION

In recent years, intense research on high-electron-mobility transistors (HEMTs) has been prevalent, particularly for high power switching and high frequency applications. III-nitride-based HEMTs utilize a heterojunction interface between two materials with different bandgaps to form a quantum well-like structure, which accommodates a two-dimensional electron gas (2DEG) region, satisfying demands of high power/frequency devices. In addition to HEMTs, examples of devices having heterostructures further include heterojunction bipolar transistors (HBT), heterojunction field effect transistor (HFET), and modulation-doped FETs (MODFET).

SUMMARY OF THE INVENTION

In accordance with one aspect of the present disclosure, a nitride-based semiconductor device is provided. The nitride-based semiconductor device includes a first nitride-based semiconductor layer, a second nitride-based semiconductor layer, a source electrode, a drain electrode, a gate electrode and a single field plate. The second nitride-based semiconductor layer is disposed on the first nitride-based semiconductor layer and has a bandgap greater than a bandgap of the first nitride-based semiconductor layer. The source electrode and the drain electrode are disposed above the second nitride-based semiconductor layer. The gate electrode is disposed above the second nitride-based semiconductor layer and between the source and drain electrodes. The single field plate is disposed over the gate electrode and extends toward the drain electrode. The field plate has a first end part, a second end part and a central part. The first and second end parts are opposite each other and are located at substantially the same height with respect to the second nitride-based semiconductor layer. Portions of the central part are in a position lower than that of the first and second end parts, and the first end part extends laterally in a length greater than a width of the gate electrode.

In accordance with one aspect of the present disclosure, a method for manufacturing a nitride-based semiconductor device is provided. The method includes steps as follows. A first nitride-based semiconductor layer is formed on a substrate. A second nitride-based semiconductor layer is formed on the first nitride-based semiconductor layer. A source electrode and a drain electrode are formed over the second nitride-based semiconductor layer. A gate electrode is formed over the second nitride-based semiconductor layer and between the source and drain electrodes. A first dielectric layer is formed above the second nitride-based semiconductor layer and covers the gate electrode, the source electrode, and the drain electrode. Recesses are formed in the dielectric layer with different depths. A single field plate is formed on the dielectric layer and in the recesses.

In accordance with one aspect of the present disclosure, a nitride-based semiconductor device is provided. The nitride-based semiconductor device includes a first nitride-based semiconductor layer, a second nitride-based semiconductor layer, a source electrode, a drain electrode, a gate electrode and a single field plate. The second nitride-based semiconductor layer is disposed on the first nitride-based semiconductor layer and has a bandgap greater than a bandgap of the first nitride-based semiconductor layer. The source electrode and the drain electrode are disposed above the second nitride-based semiconductor layer. The gate electrode is disposed above the second nitride-based semiconductor layer and between the source and drain electrodes. The single field plate is disposed over the gate electrode and extends toward a region between the gate electrode and the drain electrode. The field plate descends from a first level of height to a second level of height and rises from the second level of height to the first level of height, and the field plate has a portion extending laterally in the region at the first level of height.

By applying the above configuration, the semiconductor device adopts a single field plate which means the field plate is formed as one piece, so as to achieve a desirable electrical field distribution therein and further promote the electrical characteristics of the semiconductor device. The single field plate can be produced by a fewer and simple manufacturing steps, thereby decreasing the manufacturing costs and avoiding complexity of the manufacturing process.

BRIEF DESCRIPTION OF THE DRAWINGS

Aspects of the present disclosure are readily understood from the following detailed description when read with the accompanying figures. It should be noted that various features may not be drawn to scale. That is, the dimensions of the various features may be arbitrarily increased or reduced for clarity of discussion. Embodiments of the present disclosure are described in more detail hereinafter with reference to the drawings, in which.

DETAILED DESCRIPTION

Figure 1:
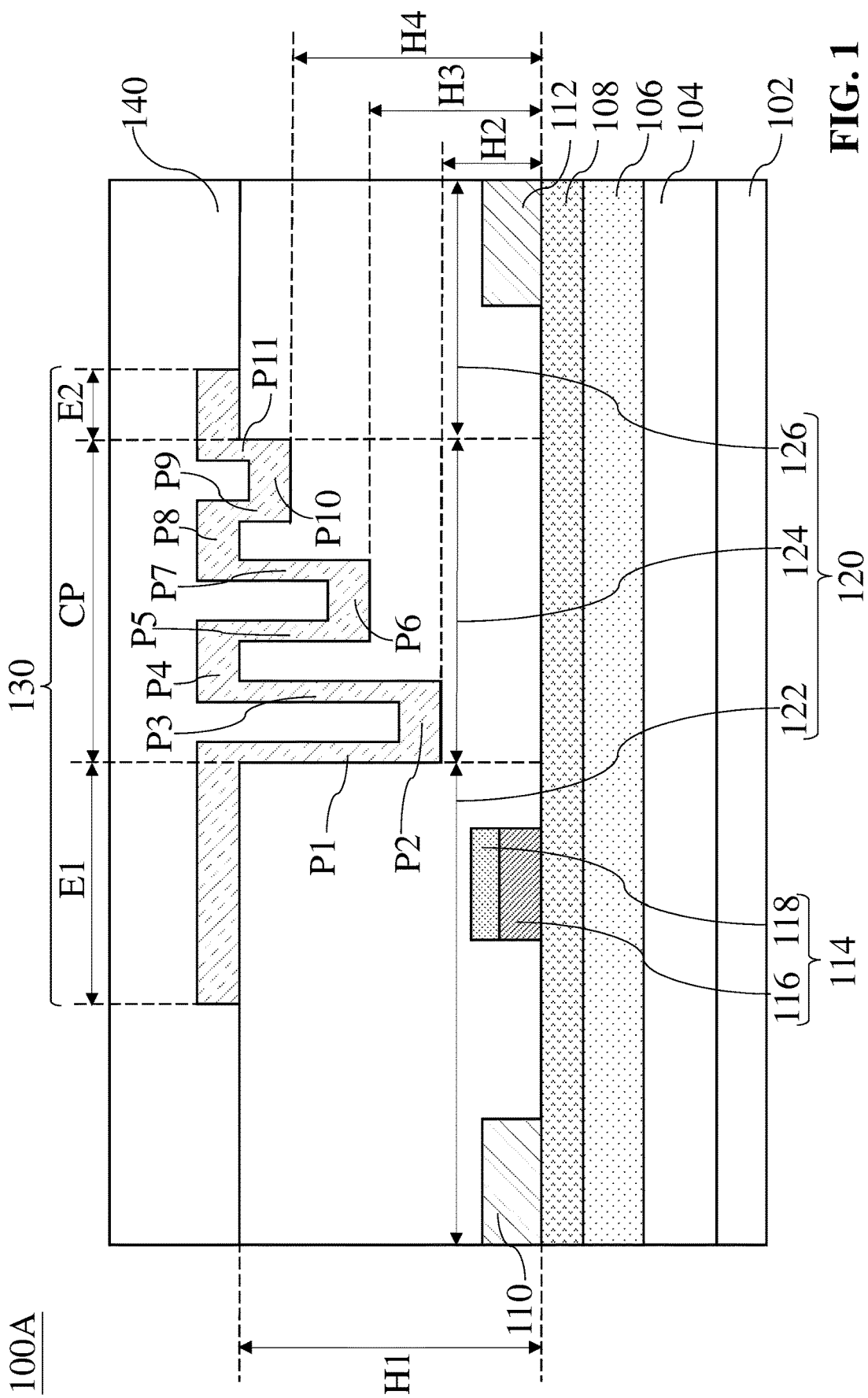
FIG. 1 is a vertical cross-sectional view of a III-nitride-based semiconductor device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "on," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

Further, it is noted that the actual shapes of the various structures depicted as approximately rectangular may, in actual device, be curved, have rounded edges, have somewhat uneven thicknesses, etc. due to device fabrication conditions. The straight lines and right angles are used solely for convenience of representation of layers and features.

In the following description, semiconductor devices/dies/packages, methods for manufacturing the same, and the likes are set forth as preferred examples. It will be apparent to those skilled in the art that modifications, including additions and/or substitutions may be made without departing from the scope and spirit of the present disclosure. Specific details may be omitted so as not to obscure the present disclosure; however, the disclosure is written to enable one skilled in the art to practice the teachings herein without undue experimentation.

FIG. 1 is a vertical cross-sectional view of a III-nitride-based semiconductor device 100A according to some embodiments of the present disclosure. The semiconductor device 100A includes a substrate 102, a buffer layer 104, nitride-based semiconductor layers 106 and 108, a source electrode 110, a drain electrode 112, a gate structure 114, a passivation layer 120, a single field plate 130 and a passivation layer 140.

The substrate 102 may be a semiconductor substrate. The exemplary materials of the substrate 102 can include, for example but are not limited to, Si, SiGe, SiC, gallium arsenide, p-doped Si, n-doped Si, sapphire, semiconductor on insulator, such as silicon on insulator (SOI), or other suitable substrate materials. In some embodiments, the substrate 102 can include, for example, but is not limited to, group III elements, group IV elements, group V elements, or combinations thereof (e.g., III-V compounds). In other embodiments, the substrate 102 can include, for example but is not limited to, one or more other features, such as a doped region, a buried layer, an epitaxial (epi) layer, or combinations thereof.

The buffer layer 104 can be disposed between the substrate 102 and the nitride-based semiconductor layer 106. The buffer layer 104 can be configured to reduce lattice and thermal mismatches between the substrate 102 and the nitride-based semiconductor layer 106, thereby curing defects due to the mismatches/difference. The buffer layer 104 may include a III-V compound. The III-V compound can include, for example but are not limited to, aluminum, gallium, indium, nitrogen, or combinations thereof. Accordingly, the exemplary materials of the buffer layer 104 can further include, for example but are not limited to, GaN, AlN, AlGaN, InAlGaN, or combinations thereof. In some embodiments, the semiconductor device 100A may further include a nucleation layer (not shown). The nucleation layer may be formed between the substrate 102 and the buffer layer 104. The nucleation layer can be configured to provide a transition to accommodate a mismatch/difference between the substrate 102 and a III-nitride layer of the buffer layer. The exemplary material of the nucleation layer can include, for example but is not limited to AlN or any of its alloys.

The nitride-based semiconductor layer 106 is disposed over the buffer layer 104. The nitride-based semiconductor layer 108 is disposed on the nitride-based semiconductor layer 106. The exemplary materials of the nitride-based semiconductor layer 106 can include, for example but are not limited to, nitrides or group III-V compounds, such as GaN, AlN, InN, $In_xAl_yGa_{(1-x-y)}N$ where x+y≤1, $Al_yGa_{(1-y)}N$ where y≤1. The exemplary materials of the nitride-based semiconductor layer 108 can include, for example but are not limited to, nitrides or group III-V compounds, such as GaN, AlN, InN, $In_xAl_yGa_{(1-x-y)}N$ where x+y≤1, $Al_yGa_{(1-y)}N$ where y≤1.

The exemplary materials of the nitride-based semiconductor layers 106 and 108 are selected such that the nitride-based semiconductor layer 108 has a bandgap (i.e., forbidden band width) greater than a bandgap of the nitride-based semiconductor layer 106, which causes electron affinities thereof different from each other and forms a heterojunction therebetween. For example, when the nitride-based semiconductor layer 106 is an undoped GaN layer having a bandgap of approximately 3.4 eV, the nitride-based semiconductor layer 108 can be selected as an AlGaN layer having bandgap of approximately 4.0 eV. As such, the nitride-based semiconductor layers 106 and 108 can serve as a channel layer and a barrier layer, respectively. A triangular well potential is generated at a bonded interface between the channel and barrier layers, so that electrons accumulate in the triangular well, thereby generating a two-dimensional electron gas (2DEG) region adjacent to the heterojunction. Accordingly, the semiconductor device 100A is available to include at least one GaN-based high-electron-mobility transistor (HEMT).

The source electrode 110 and the drain electrode 112 are disposed on the nitride-based semiconductor layer 108. The source electrode 110 and the drain electrode 112 are in contact with the nitride-based semiconductor layer 108. In some embodiments, the source electrode 110 and the drain electrode 112 can include, for example but are not limited to, metals, alloys, doped semiconductor materials (such as doped crystalline silicon), compounds such as silicides and nitrides, other conductor materials, or combinations thereof. The exemplary materials of the source electrode 110 and the drain electrode 112 can include, for example but are not limited to, Ti, AlSi, TiN, or combinations thereof. The source electrode 110 and the drain electrode 112 may be a single layer, or plural layers of the same or different composition. In some embodiments, the source electrode 110 and the drain electrode 112 form ohmic contact with the nitride-based semiconductor layer 108. The ohmic contact can be achieved by applying Ti, Al, or other suitable materials to the source electrode 110 and the drain electrode 112. In some embodiments, each of the source electrode 110 and the drain electrode 112 is formed by at least one conformal layer and a conductive filling. The conformal layer can wrap the conductive filling. The exemplary materials of the conformal layer, for example but are not limited to, Ti, Ta, TiN, Al, Au, AlSi, Ni, Pt, or combinations thereof. The exemplary materials of the conductive filling can include, for example but are not limited to, AlSi, AlCu, or combinations thereof.

The gate structure 114 is disposed on the nitride-based semiconductor layer 108. The gate structure 114 is located between the source electrode 110 and the drain electrode 112. That is, the source electrode 110 and the drain electrode 112 can be located at two opposite sides of the gate structure 114, respectively. In some embodiments, the source electrode 110 and the drain electrode 112 are asymmetrical about the gate structure 114. For example, the source electrode 110 can be closer to the gate electrode 130 than the drain electrode 112. The gate structure 114 includes a doped III-V compound semiconductor layer 116 and a gate electrode 118. The doped III-V compound semiconductor layer 116 is between the gate electrode 118 and the nitride-based semiconductor layer 108. The doped III-V compound semiconductor layer 116 is in contact with the gate electrode 118 and the nitride-based semiconductor layer 108.

In the exemplary illustration of FIG. 1, the semiconductor device 100A is an enhancement mode device, which is in a normally-off state when the gate electrode 118 is at approximately zero bias. Specifically, the doped III-V semiconductor layer 116 may create at least one p-n junction with the nitride-based semiconductor layer 108 to deplete the 2DEG region, such that at least one zone of the 2DEG region corresponding to a position below the corresponding the gate structure 114 has different characteristics (e.g., different electron concentrations) than the rest of the 2DEG region and thus is blocked. Due to such mechanism, the semiconductor device 100A has a normally-off characteristic. In other words, when no voltage is applied to the gate electrode 118 or a voltage applied to the gate electrode 118 is less than a threshold voltage (i.e., a minimum voltage required to form an inversion layer below the gate electrode 118), the zone of the 2DEG region below the gate electrode 118 is kept blocked, and thus no current flows therethrough.

In some embodiments, the doped III-V semiconductor layer 116 can be omitted, such that the semiconductor device 100A is a depletion-mode device, which means the semiconductor device 100A in a normally-on state at zero gate-source voltage.

The doped III-V compound semiconductor layer 116 can be a p-type doped III-V compound semiconductor layer. The exemplary materials of the doped III-V compound semiconductor layer 116 can include, for example but are not limited to, p-doped group III-V nitride semiconductor materials, such as p-type GaN, p-type AlGaN, p-type InN, p-type AlInN, p-type InGaN, p-type AlInGaN, or combinations thereof. In some embodiments, the p-doped materials are achieved by using a p-type impurity, such as Be, Mg, Zn, Cd, and Mg. In some embodiments, the nitride-based semiconductor layer 106 includes undoped GaN and the nitride-based semiconductor layer 108 includes AlGaN, and the p-type doped III-V compound semiconductor layer 116 is a p-type GaN layer which can bend the underlying band structure upwards and to deplete the corresponding zone of the 2DEG region, so as to place the semiconductor device 100A into an off-state condition. In some embodiments, the gate electrode 118 may include metals or metal compounds. The gate electrode 118 may be formed as a single layer, or plural layers of the same or different compositions. The exemplary materials of the metals or metal compounds can include, for example but are not limited to, W, Au, Pd, Ti, Ta, Co, Ni, Pt, Mo, TiN, TaN, metal alloys or compounds thereof, or other metallic compounds. In some embodiments, the exemplary materials of the gate electrode 118 may include, for example but are not limited to, nitrides, oxides, silicides, doped semiconductors, or combinations thereof.

The passivation layer 120 covers the source electrode 110, the gate structure 114 and the drain electrode 112. To be more specific, the passivation layer 120 includes a left part 122, a central part 124 and a right part 126. The central part 124 is between the left part 122 and the right part 126, so as to connect the left and right parts 122 and 126. The left part 122 covers the source electrode 110 and the gate structure 114. The right part 126 covers the drain electrode 112. The gate structure 114 and the drain electrode 112 are free form the coverage of the central part 124. Each of the left and right parts 122, 126 has a planar/flat surface, and the central part 124 has recesses and protrusions which are alternately arranged along a direction pointing toward the right part 126 from the left part 122. Each of the protrusions is located between the two adjacent recesses. The depths of the recesses decrease gradually along the direction pointing toward the right part 122 from the left part 126. The heights of top surfaces of the protrusions with respect to the nitride-based semiconductor layer 108 can be the same as the heights of top surfaces of the left and right parts 122, 126 with respect to the nitride-based semiconductor layer 106.

The passivation layer 120 can be formed for a protection purpose or for enhancing the electrical properties of the device (e.g., by providing an electrical isolation effect between/among different layers/elements). The exemplary materials of the passivation layer 120 can include, for example but are not limited to, $SiN_x$, $SiO_x$, $Si_3N_4$, SiON, SiC, SiBN, SiCBN, oxides, nitrides, poly(2-ethyl-2-oxazoline) (PEOX), or combinations thereof. In some embodiments, the passivation layer 120 can be a multi-layered structure, such as a composite dielectric layer of $Al_2O_3$/SiN, $Al_2O_3$/$SiO_2$, AlN/SiN, AlN/$SiO_2$, or combinations thereof.

The single field plate 130 is disposed over the passivation layer 120. Herein, the phrase "single field plate" represents that the field plate is one-piece formed so as to make up a single (or undivided) complete piece. That is to say, there is no distinguishable interface/boundary exists inside the single field plate 130. By applying the single field plate 130 to the semiconductor device 100A, the manufacturing process of the semiconductor device 100A can be simplified, reducing potential alignment errors and the cost during the manufacturing process.

Figure 2:
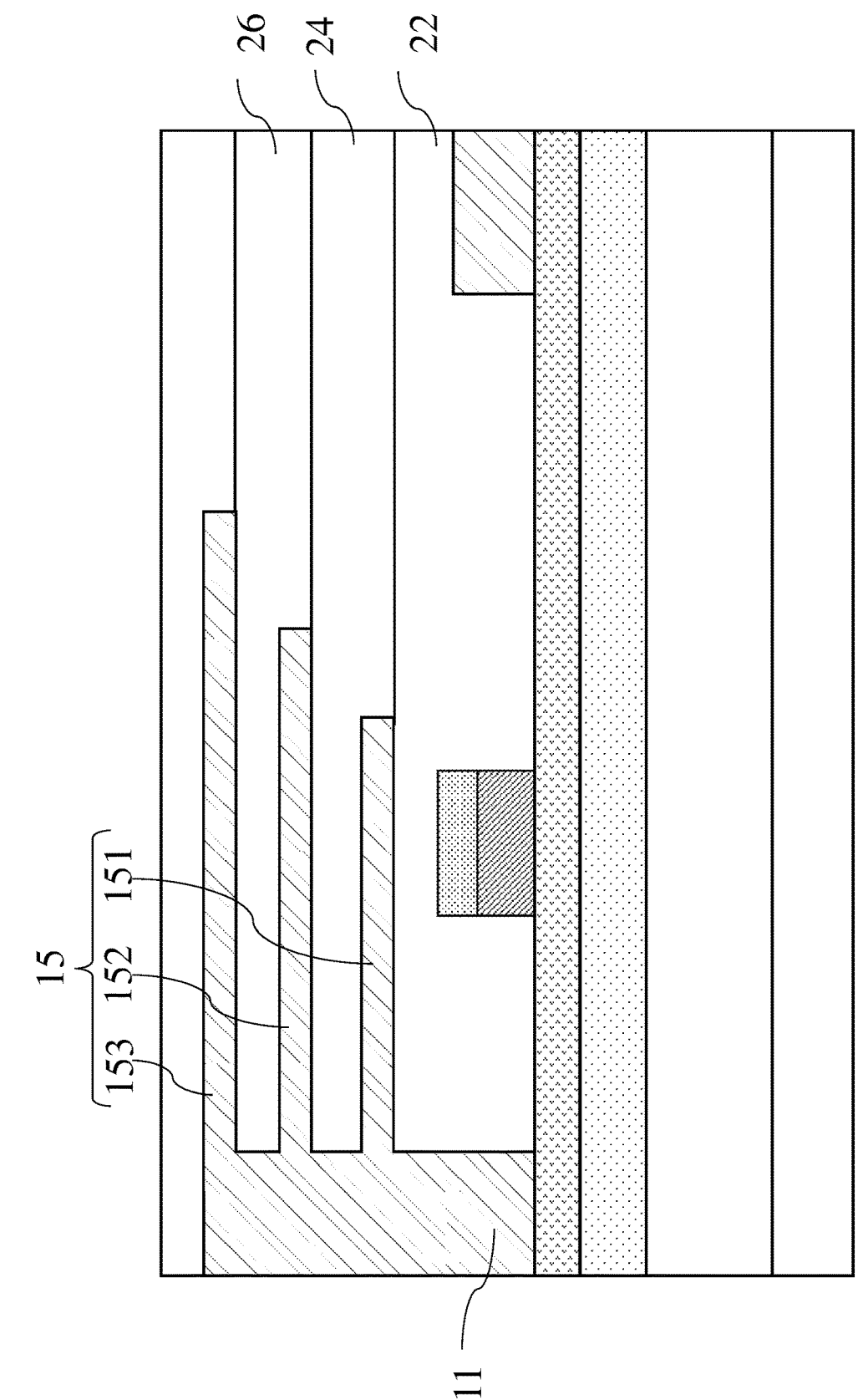
FIG. 2 is a vertical cross-sectional view of a semiconductor device according to a comparative embodiment.

To clearly describe how potential alignment errors occur, FIG. 2 is a vertical cross-sectional view of a semiconductor device 10 according to a comparative embodiment. The semiconductor device 10 adopts a multi-field-plate structure design. To be more specific, the multi-field-plate structure 15 connects to the source electrode 11 and has field plates 151, 152 and 153 extending laterally with increasing field plate lengths. The field plates 151, 152 and 153 are formed on top surfaces of the passivation layers 22, 24 and 26, respectively. Although the field plates 151, 152 and 153 are desired to better disperse the electric field distribution, the manufacturing process of the multi-field-plate structure 15 is costly and complex. For example, the fabrication of any one of the field plates 151, 152 and 153 at least includes dielectric deposition, metal deposition, and a photolithography stage in sequence. Such fabrication would be performed three times due to the need for the three field plates 151, 152 and 153, which means it is required to perform multiple sets of exposure and etching steps to constitute the multi-field-plate structure 15. That is, as more sets of exposure and etching steps are to be performed, alignment errors would occur, which can cause the electrical characteristics of the semiconductor device 10 to suffer. Furthermore, distinguishable interfaces/boundaries may exist in the multi-field-plate structure 15 due to laminated manufacturing that might serve as uncertain factors in the semiconductor device 10.

Referring to FIG. 1 again, the semiconductor device 100A utilizes a single field plate design. The profile of the single field plate 130 can be determined by the recesses with different depths of the passivation layer 120. In this regard, the recesses of the passivation layer 120 can be formed by using a halftone photomask or a gray tone photomask and thus be defined by one set of exposure and etching steps. Thereafter, when a field plate metal layer is deposited on the passivation layer 120, the profile of the single field plate 130 would result from the surface morphology of the passivation layer 120. Accordingly, the manufacturing process of the single field plate 130 is simplified, such that potential alignment errors and the cost are reduced.

In addition to simplify the fabrication, the single field plate 130 can reshape the electrical field according to the profile thereof, which can be equivalent with the effect provided by multiple field plates. The following descriptions are made to explain the mechanism.

The single field plate 130 spans across the gate structure 114. An orthogonal projection of the field plate 130 on the nitride-based semiconductor layer 108 overlaps with an orthogonal projection of the gate structure 114 on the nitride-based semiconductor layer 108. In detail, the single field plate 130 includes end parts E1 and E2 which are opposite each other and a central part CP located between the end parts E1 and E2. The end parts E1 and E2 are disposed on top surfaces of the left and right parts 122 and 126, respectively, such that the end parts E1 and E2 can be located at substantially the same height with respect to the nitride-based semiconductor layer 108.

The end part E1 is directly disposed over the gate structure 114. The end part E1 spans across the gate structure 114. From another perspective, the end part E1 extends laterally from a region between the source electrode 110 and the gate structure 114 into a region between the gate structure 114 and the drain electrode 112. The end part E1 extends laterally in a length greater than a width of the gate electrode 118. Accordingly, the end part E1 can reshape the electrical field of the source-side and the drain-side near the gate structure 114. The end part E1 is physically separated from the source electrode 110 by the passivation layer 120. The end part E2 extends laterally in an extending length less than that of the end part E1.

The central part CP is located within a region between the gate electrode 118 and the drain electrode 112. To illustrate, portions of the central part CP from the far left to the far right are labeled as portions P1-P11 in sequence. The central part CP of the field plate 130 is conformally disposed with the central part 124 of the passivation layer 120 (i.e., be conformal with the recesses and protrusions of the central part 124). Due to the conformal configuration of the central part CP and the central part 124, the central part CP of the single field plate 130 can include three groups of portions. For example, with respect to the first group, the portions P1, P3, P5, P7, P9 and P11 extend upward/downward between two different levels of height. With respect to the second group, the portions P2, P6 and P10 respectively extend laterally at levels of height H2, H3 and H4, which are lower than the level of height H1 of the end parts E1 and E2. With respect to the second group, the portions P4 and P8 extend laterally at the same level of height as that of the end parts E1 and E2.

As used herein, the height refers to a distance with respect to the nitride-based semiconductor layer 108. In the exemplary illustration of FIG. 1, the level of height H1 with respect to the nitride-based semiconductor layer 108 is greater than the level of height H4 with respect to the nitride-based semiconductor layer 108. The level of height H4 is greater than the level of height H3 with respect to the nitride-based semiconductor layer 108. The level of height H3 is greater than the level of height H2 with respect to the nitride-based semiconductor layer 108.

To be more specific, the portion P1 extends downward (or descends) from the level of height H1 to the level of height H2, so as to connect the end part E1 and the portion P2. The portion P3 extends upward (or rises) from the level of height H2 to the level of height H1, so as to connect the portions P2 and P4. The portion P5 extends downward (or descends) from the level of height H1 to the level of height H3, so as to connect the portions P4 and P6. The portion P7 extends upward (or rises) from the level of height H3 to the level of height H1, so as to connect the portions P6 and P8. The portion P9 extends downward (or descends) from the level of height H1 to the level of height H4, so as to connect the portions P8 and P10. The portion P11 extends upward (or rises) from the level of height H4 to the level of height H1, so as to connect the portion P10 and the end part E2. The downward/upward extending lengths of the portions P1, P3, P5, P7, P9, P11 decrease gradually along the direction pointing toward the end part E2 from the end part E1. In other words, each of the portions P1, P5 and P9 extends downward to approach the nitride-based semiconductor layer 108. Each of the portions P3, P7 and P11 extends upward away from the nitride-based semiconductor layer 108.

The portions P2, P6 and P10 extend laterally at different levels of height lower than the end parts E1 and E2. The portion P2 connects the portions P1 and P3. The portion P6 connects the portions P5 and P7. The portion P10 connects the portions P9 and P11. The portions P2, P6 and P10 can be referred to as bottom portions of the central parts CP. The portions P2, P6 and P10 are flat portions. The heights of the portions P2, P6 and P10 increase gradually along the direction pointing toward from the end part E1 to the end part E2. Viewed from another angle, the thicknesses of the central part 124 of the passivation layer 120 (or can be referred to as dielectric thicknesses) underneath the portions P2, P6 and P10 increase gradually.

The portions P4 and P8 extends laterally at the level of height H1. The portion P4 connects the portions P3 and P5. The portion P8 connects the portions P7 and P9. The portions P4 and P8 can be referred to as top portions of the central parts CP. The portions P4 and P8 are flat portions.

Accordingly, the central part CP can extend downward, laterally, upward, and laterally to constitute a stepwise profile. Explained in another way, the whole profile of the central part CP can be viewed as a combination of a series of the U-shaped profiles with different depths. The central part CP can form a recessed portion.

In some operations, the electric field will reach maximum at a gate edge toward a drain (i.e., a drain-side gate edge), which leads to breakdown and current collapse. Accordingly, the field plate design is implemented to reduce the peak electric field at the gate edge, improving uniformity of electric field distribution and hence increasing breakdown voltage. The portions P2, P6, and P10 which have gradually increasing levels of height H2, H3, and H4 can serve as three field plates at different vertical locations, which can distribute the electric field as a gradient distribution, thereby reshaping the electric field and reducing the peak electric field stepwise. Therefore, the central part CP can reshape the electrical field between the gate electrode 118 and the drain electrode 112 (i.e., a drain-side of the gate electrode 118). In some embodiments, the end part E1 may have a profile as the afore-mentioned central part CP. For example, the end part E1 can be formed to have a multi-U-shaped profile with different depths between the source electrode 110 and the gate structure 114.

The exemplary materials of the single field plate 130 can include, for example but are not limited to, conductive materials, such as Ti, Ta, TiN, TaN, or combinations thereof. In some embodiments, other conductive materials such as Al, Cu doped Si, and alloys including these materials may also be used.

The passivation layer 140 is disposed on the passivation layer 120, and covers the single field plate 130. Some bottom portions of the passivation layer 140 can be wrapped by the recessed portion of the central part CP. The passivation layer 140 can serve as a planarization layer which has a level top surface to support other layers/elements. In some embodiments, the passivation layer 140 can be formed as a thicker layer, and a planarization process, such as chemical mechanical polish (CMP) process, is performed on the passivation layer 140 to remove the excess portions, thereby forming a level top surface. The materials of the passivation layer 140 can be identical or similar to those of the passivation layer 120.

Different stages of a method for manufacturing the semiconductor device 100A are shown in FIG. 3A, FIG. 3B, FIG. 3C, FIG. 3D, FIG. 3E, FIG. 3F, FIG. 3G and FIG. 3H, described below. In the following, deposition techniques can include, for example but are not limited to, atomic layer deposition (ALD), physical vapor deposition (PVD), chemical vapor deposition (CVD), metal organic CVD (MOCVD), plasma enhanced CVD (PECVD), low-pressure CVD (LPCVD), plasma-assisted vapor deposition, epitaxial growth, or other suitable processes.

Figure 3B:
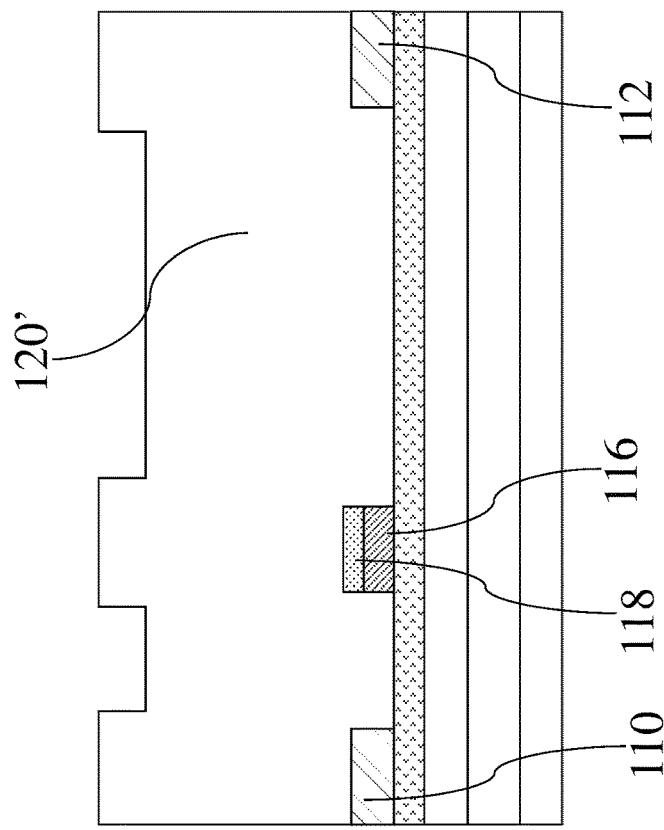
FIG. 3A, FIG. 3B, FIG. 3C, FIG. 3D, FIG. 3E, FIG. 3F, FIG. 3G and FIG. 3H show different stages of a method for manufacturing a nitride-based semiconductor device according to some embodiments of the present disclosure.
Figure 3A:
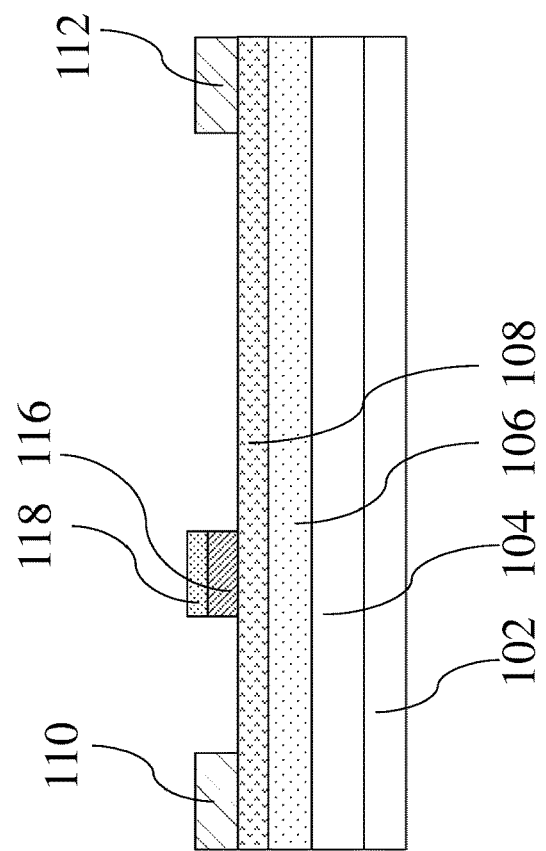

Referring to FIG. 3A, a substrate 102 is provided. A buffer layer 104, nitride-based semiconductor layers 106, 108 can be formed over the substrate 102 in sequence by using deposition techniques. To be more specific, the buffer layer 104 is formed on a substrate 102. The nitride-based semiconductor layer 106 is formed on the buffer layer 104. The nitride-based semiconductor layer 108 is formed on the nitride-based semiconductor layer 106. Thereafter, a source electrode 110, a drain electrode 112, a doped III-V compound semiconductor layer 116, and a gate electrode 118 can be formed over the nitride-based semiconductor layer 108. The doped III-V compound semiconductor layer 116 and the gate electrode 118 are located between the source and drain electrodes 110 and 112. The formation of the source and drain electrodes 110 and 112, the doped III-V compound semiconductor layer 116 and the gate electrode 118 includes deposition techniques and a patterning process, wherein the deposition techniques can be performed for forming a blanket layer, and the patterning process can be performed for removing excess portions thereof. In some embodiments, the patterning process can include photolithography, exposure and development, etching, other suitable processes, or combinations thereof.

Referring to FIG. 3B, a passivation (or dielectric) layer 120' is formed to cover the doped III-V compound semiconductor layer 116, the gate electrode 118, the source electrode 110, and the drain electrode 112. Since the existence of the source and drain electrodes 110 and 112, the doped III-V compound semiconductor layer 116 and the gate electrode 118, the passivation layer 120' is conformal with them and thus have protrusions. Then, a planarization process (e.g., a CMP process) is performed on the passivation layer 120' so as to remove the excess portions thereof, making its top surface flat.

Figure 3D:
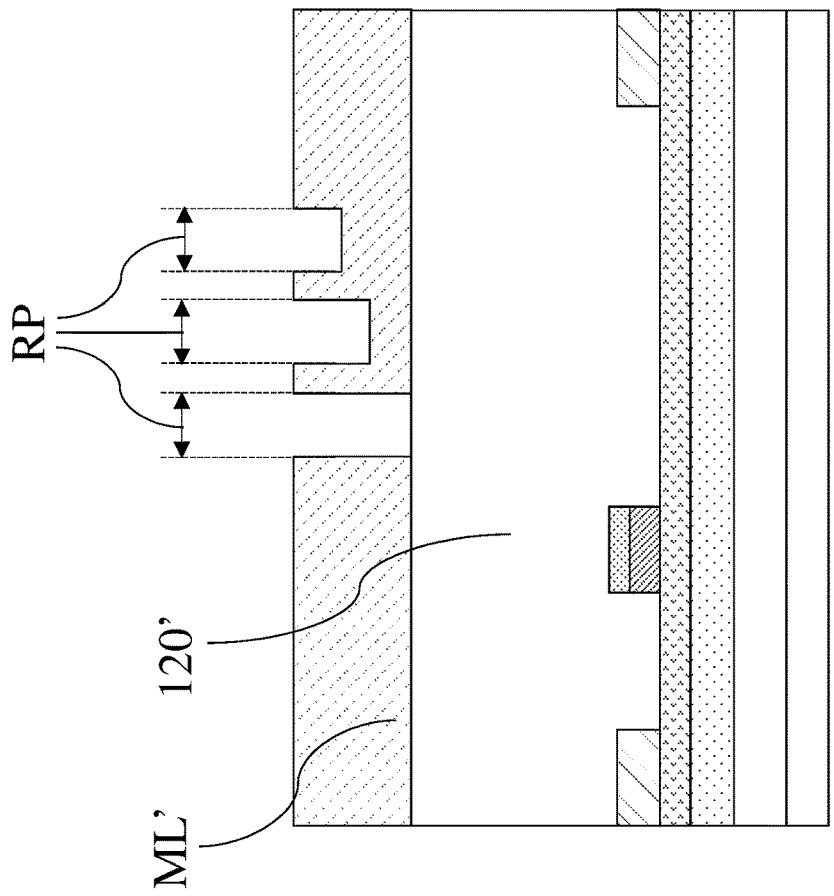
Figure 3C:
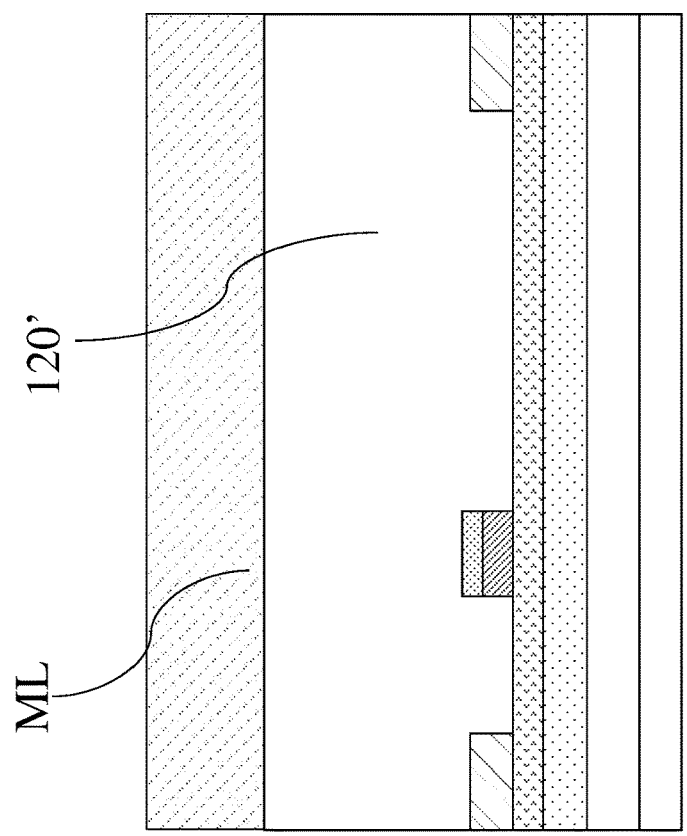

Referring to FIG. 3C, a mask layer ML is formed on top surface of the blanket passivation layer 120'. The mask layer ML can be a photoresist layer, which is employed for the subsequent process.

Referring to FIG. 3D, a photomask (not shown) with a series of predetermined recess patterns is provided and aligned with the mask layer ML. In some embodiments, the photomask can be a half tone photomask. In some embodiments, the photomask can be a gray tone photomask. More specifically, some regions of the photomask can have different light transmittance (or absorptance). Then, an exposure process can be performed on the mask layer ML using the photomask. After a developing process, some portions of the mask layer ML are removed, resulting in a mask layer ML' with recess patterns RP.

Figure 3F:
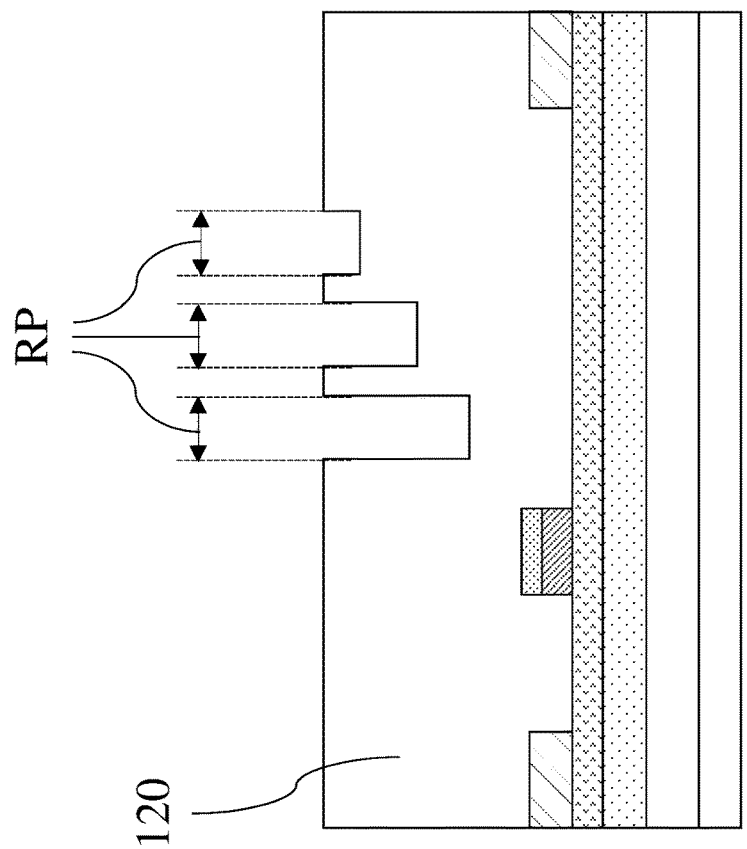
Figure 3E:
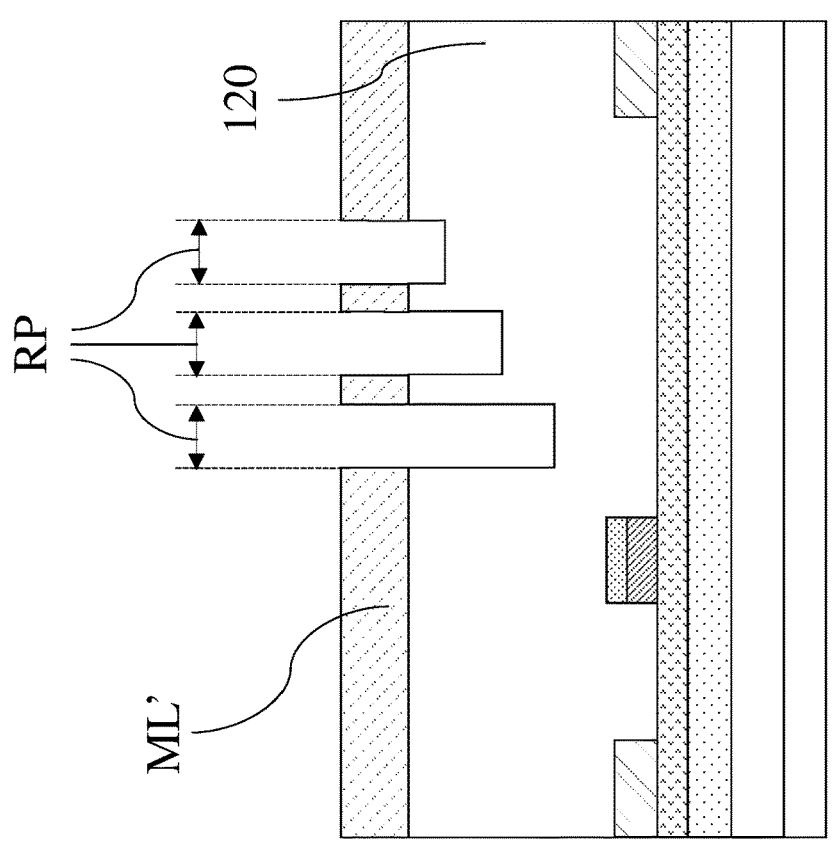

Referring to FIG. 3E, an etching process is performed on the blanket passivation layer 120' using the mask layer ML'. The etching process can be an anisotropic etching process. The etching process would remove some portions of the mask layer ML'. As such, the mask layer ML' becomes thinner, and the recess patterns RP are further recessed to expose the underlying passivation layer 120'. The exposed portions of the passivation layer 120' will be removed during the etching process. Hence, the recess patterns RP are transferred to the passivation layer 120' so as to form recesses in the passivation layer 120.

Referring to FIG. 3F, the mask layer ML' on the passivation layer 120 is removed after the formation of the recesses in the passivation layer 120. In some embodiments, a plasma etching process can be performed to remove the mask layer ML'.

Figure 3H:
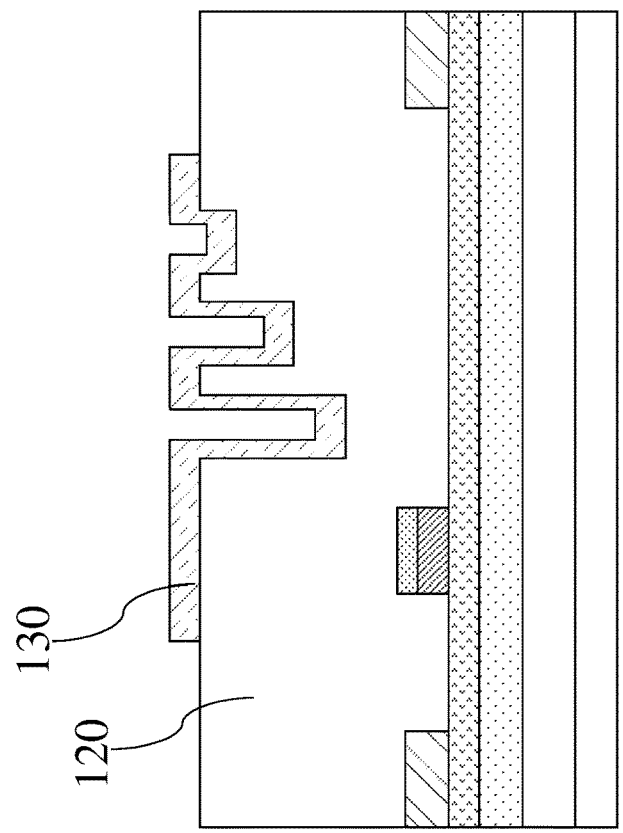
Figure 3G:
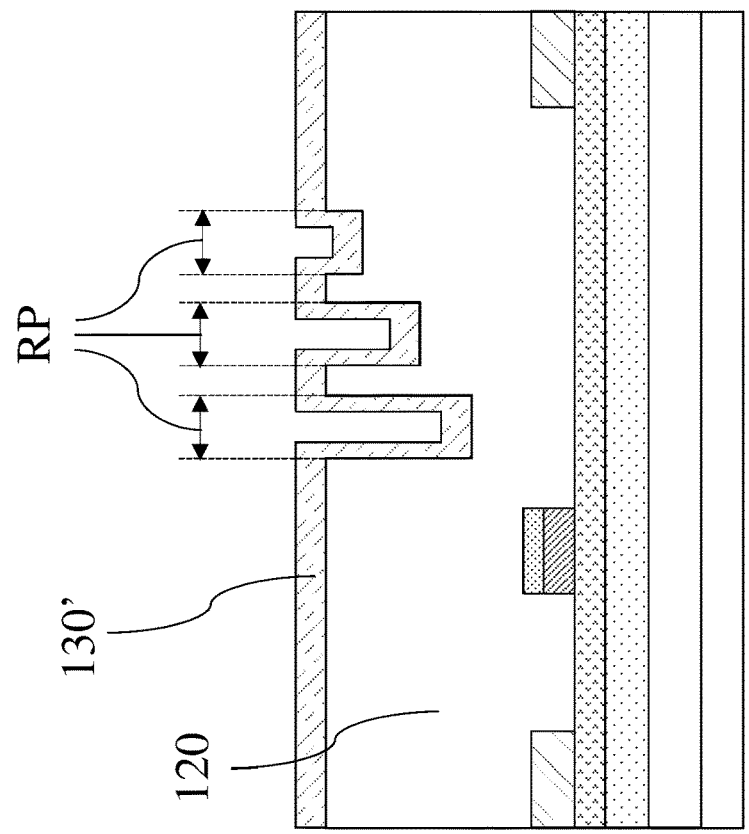

Referring to FIG. 3G, a blanket field plate layer 130' is formed on the passivation layer 120. In some embodiments, the formation of the blanket field plate layer 130' is performed by using deposition techniques. The blanket field plate layer 130' is conformal with the passivation layer 120, such some of the blanket field plate layer 130' is within the recess patterns RP.

Referring to FIG. 3H, a patterning process is performed on the blanket field plate layer 130' to remove unwanted portions so as to form a single field plate 130. It should be noted that the single field plate 130 has no distinguishable interface/boundary therein. After the formation of the single field plate 130, the passivation layer 140 is formed to cover the single field plate 130 and the passivation layer 120, obtaining the configuration of the semiconductor device 100A as shown in FIG. 1.

Figure 4:
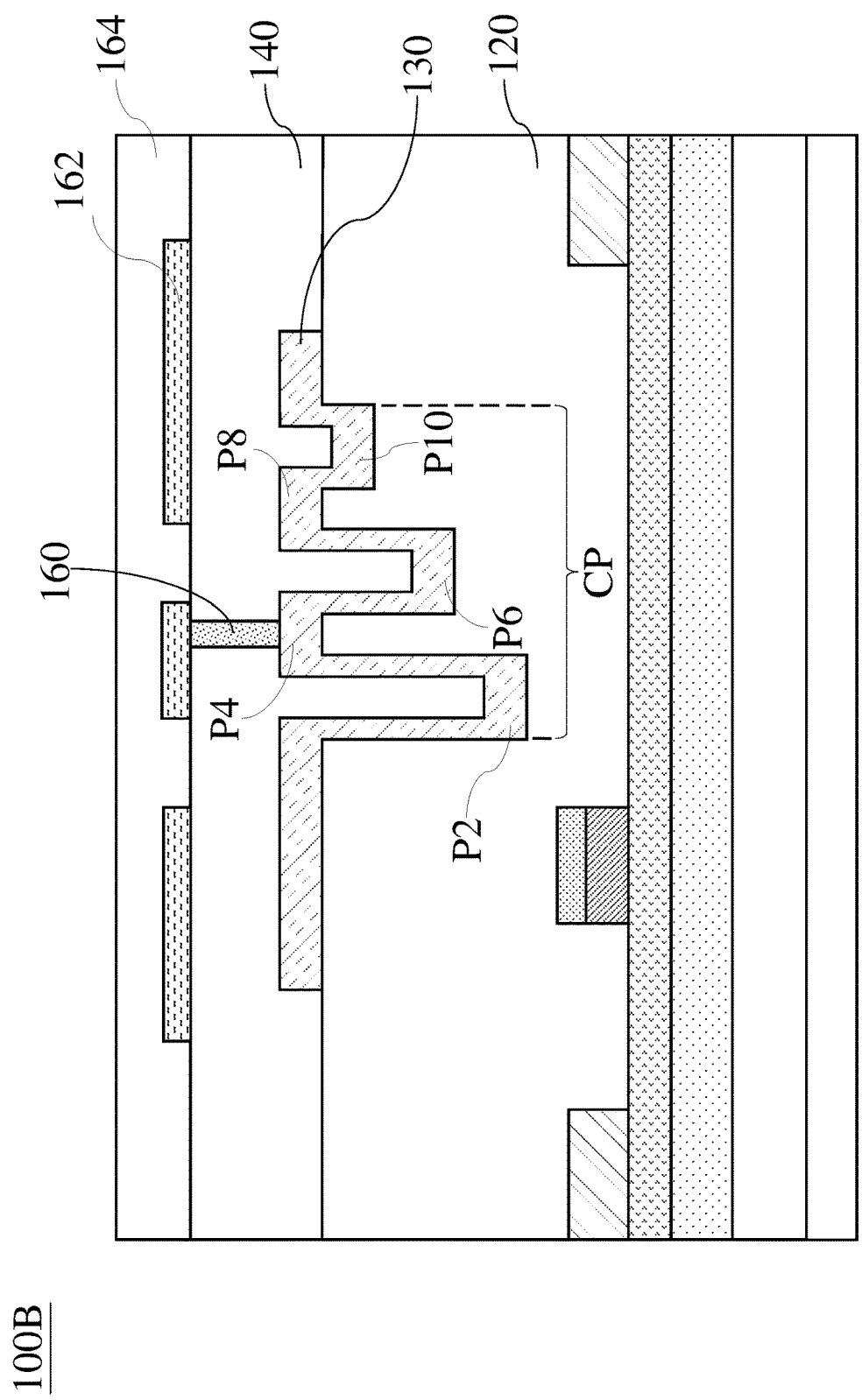
FIG. 4 is a vertical cross-sectional view of a III-nitride-based semiconductor device according to some embodiments of the present disclosure.

FIG. 4 is a vertical cross-sectional view of a III-nitride-based semiconductor device 100B according to some embodiments of the present disclosure. The semiconductor device 100B further includes a conductive via 160 (which can be referred to as a contact via), a patterned conductive layer 162 and a passivation layer 164.

The conductive via 160 can longitudinally penetrate the passivation layer 140 to make contact with the single field plate 130. The conductive via 160 can be formed on a top surface of the portion P4 of the central part CP of the single field plate 130. The patterned conductive layer 162 is disposed on a top surface of the passivation layer 140. The conductive via 160 can physically connect the single field plate 130 and the patterned conductive layer 162, such that the single field plate 130 can be electrically coupled with an external circuit. For example, the single field plate 130 can be electrically coupled with an electrical potential source through the conductive via 160 and the patterned conductive layer 162. In this regard, due to flatness of the flat portions P4 and P8 of the central part CP, it is advantageous to form an element on the portions P4 and P8. For example, a bottom of the conductive via 160 can abut well on the flat portions P4 or/and P8 to ensure a well contact therebetween. Furthermore, since portions P4 and P8 have the top-most surfaces in the single field plate 130 with respect to the portions P2, P6 or P10, there would be less amount of passivation layer 140 to be removed prior to the formation of the conductive via 160, improving the reliability of the manufacturing process. The passivation layer 164 covers the patterned conductive layer 162 and the passivation layer 140.

The exemplary materials of the conductive via 160 can include, but are not limited to, conductive materials, for example, metal or alloys. The patterned conductive layer 162 may have metal lines, pads, traces, or combinations thereof, such that the patterned conductive layer 162 can form at least one circuit. The patterned conductive layer 162 may include, but are not limited to, a single film or multi-layered film having Ag, Al, Cu, Mo, Ni, Ti, alloys thereof, oxides thereof, nitrides thereof, or combinations thereof. The materials of the passivation layer 164 can be similar to the passivation layers 120 and 140.

Figure 5:
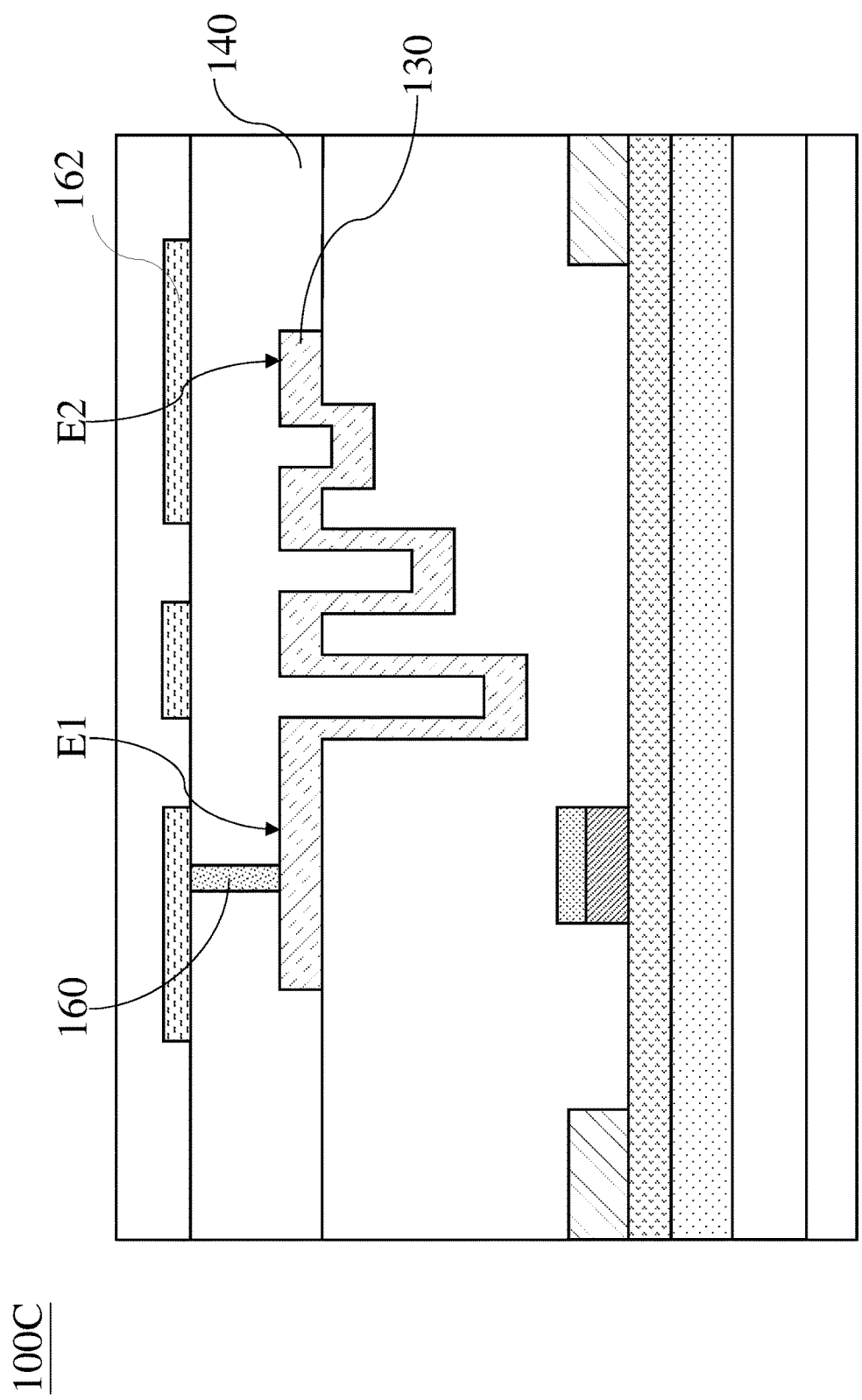
FIG. 5 is a vertical cross-sectional view of a III-nitride-based semiconductor device according to some embodiments of the present disclosure.

FIG. 5 is a vertical cross-sectional view of a III-nitride-based semiconductor device 100C according to some embodiments of the present disclosure. In the present embodiment, the conductive via 160 connects the end part E1 and the patterned conductive layer 162. Similarly, due to flatness of the end part E1 (or the end part E2), it is advantageous to form an element on the end part E1 (or the end part E2).

Figure 6:
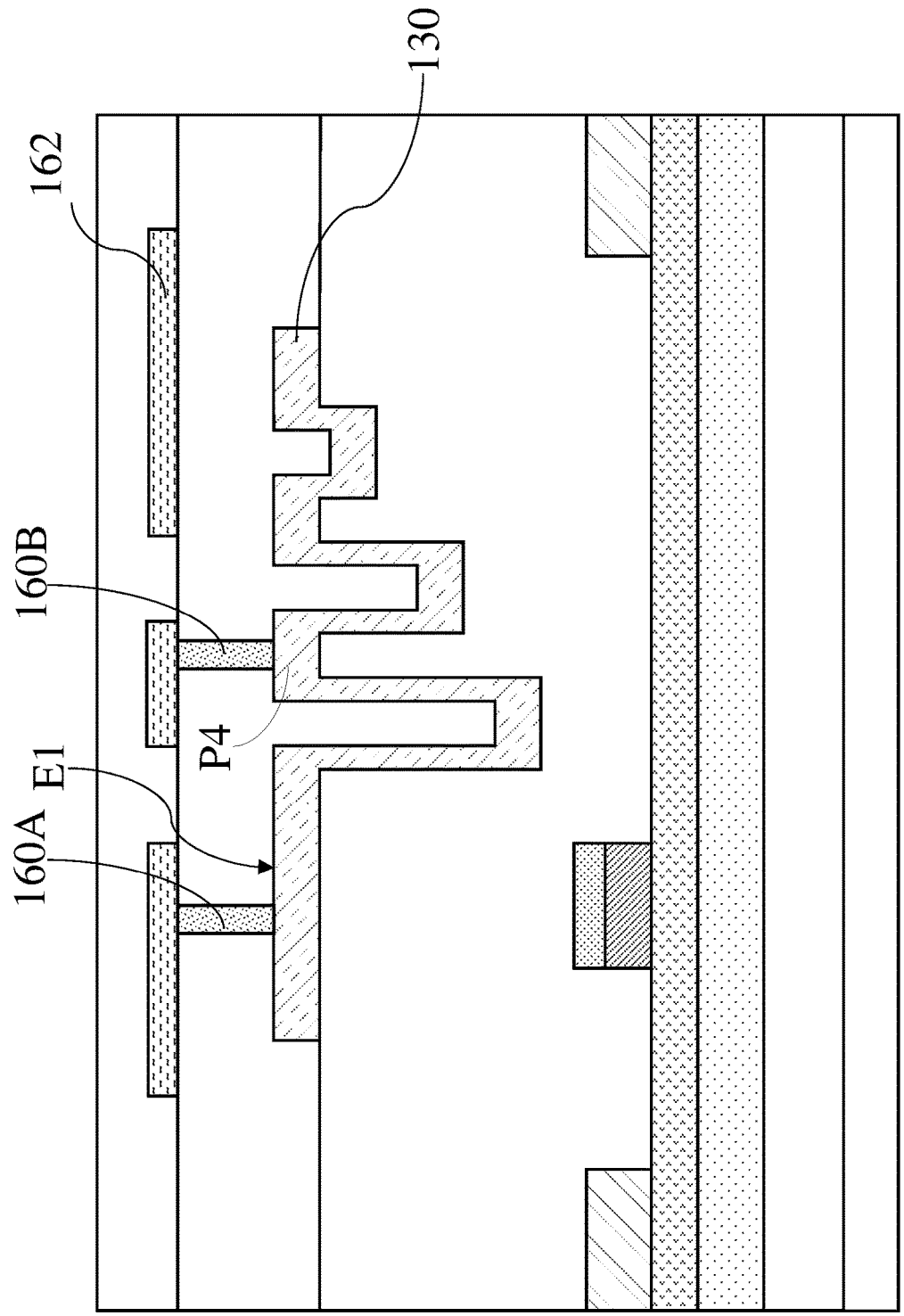
FIG. 6 is a vertical cross-sectional view of a III-nitride-based semiconductor device according to some embodiments of the present disclosure.

FIG. 6 is a vertical cross-sectional view of a III-nitride-based semiconductor device 100D according to some embodiments of the present disclosure. In the present embodiment, the conductive via 160A connects the end part E1 and the patterned conductive layer 162, and the conductive via 160B connects the portion P4 and the patterned conductive layer 162. The single field plate 130 can provide more than one flat surface so more than one conductive via can be formed to connect the single field plate 130.

Figure 7:
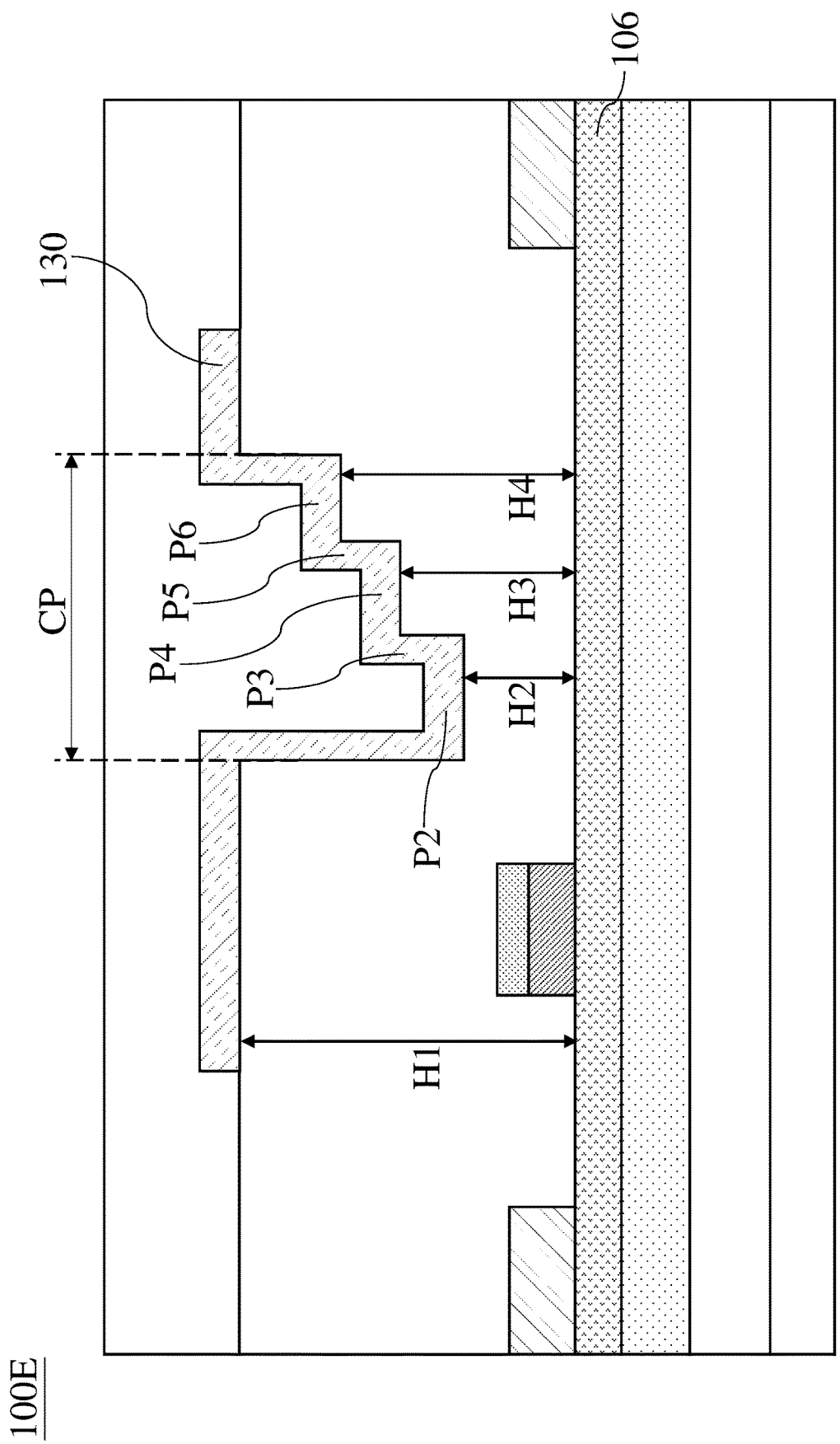
FIG. 7 is a vertical cross-sectional view of a III-nitride-based semiconductor device according to some embodiments of the present disclosure.

FIG. 7 is a vertical cross-sectional view of a semiconductor device 100E according to some embodiments of the present disclosure. In the exemplary illustration of FIG. 7, the central part CP extends laterally and upward to constitute a stepwise profile. The portion P3 extends upward from the level of height H2 to the level of height H3 so as to connects the portions P2 and P4. The portion P5 extends upward from the level of height H3 to the level of height H4 so as to connects the portions P4 and P6. The levels of height H2, H3 and H4 are lower than the level of height H1.

Figure 8:
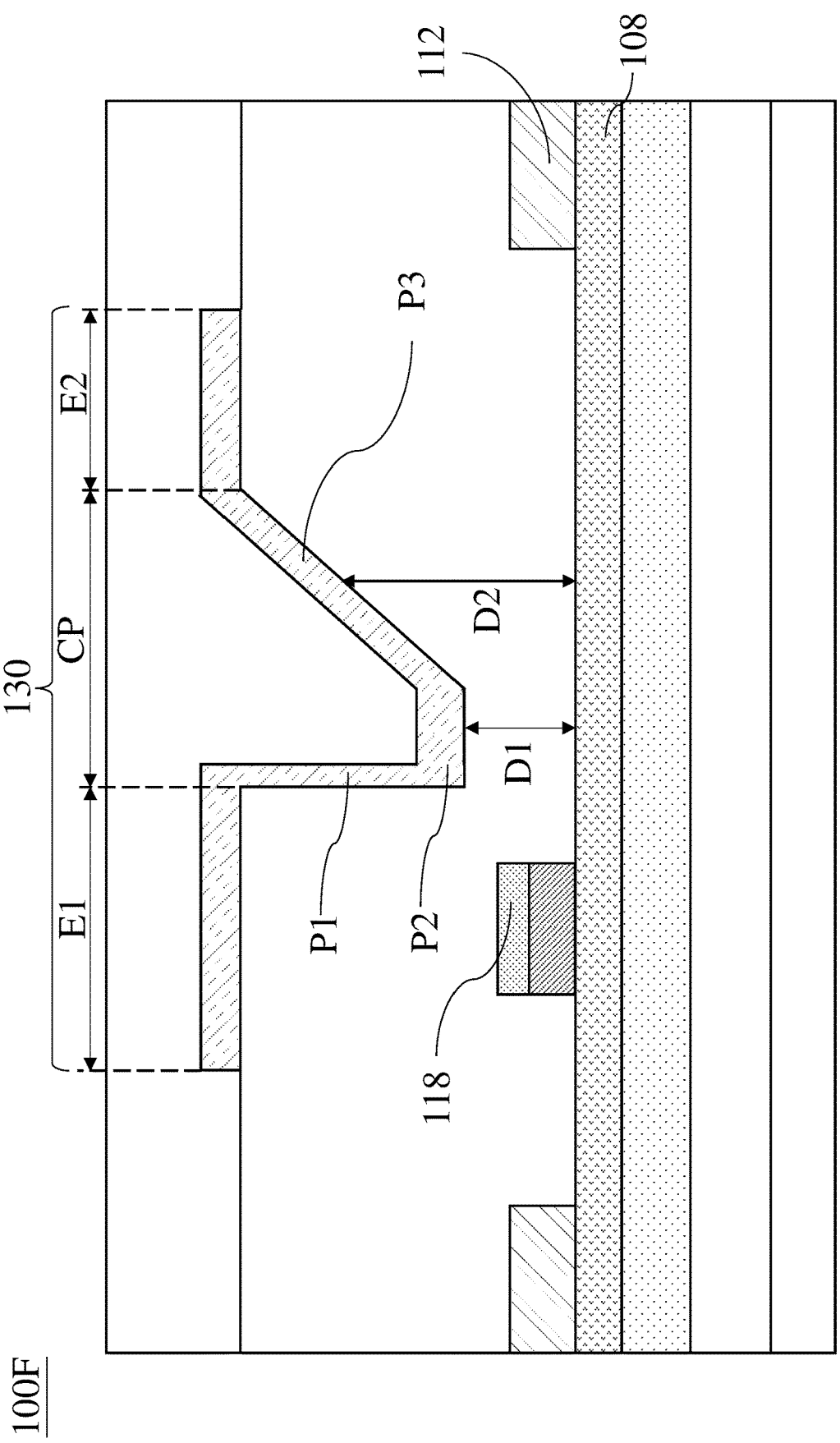
FIG. 8 is a vertical cross-sectional view of a III-nitride-based semiconductor device according to some embodiments of the present disclosure.

FIG. 8 is a vertical cross-sectional view of a semiconductor device 100F according to some embodiments of the present disclosure. In the exemplary illustration of FIG. 8, the central part CP extends downward, laterally and obliquely upward so as to connect the end part E2. From another perspective, the central part CP includes portions P1, P2 and P3. The portion P1 connects the end part E1 and the portion P2. The portion P2 connects the portion P1 and the portion P3. The portion P3 connects the portion P2 and the end part E2. A distance D1 from the portion P2 to the nitride-based semiconductor layer 108 is constant along the direction pointing toward the drain electrode 112 from the gate electrode 118. A distance D2 from the portion P3 of the central part CP to the nitride-based semiconductor layer 108 incrementally increases along the direction pointing toward the drain electrode 112 from the gate electrode 118. The distance D1 is less than the distance D2. The portion P2 can be regard as the bottom portion of the central part CP.

Figure 9:
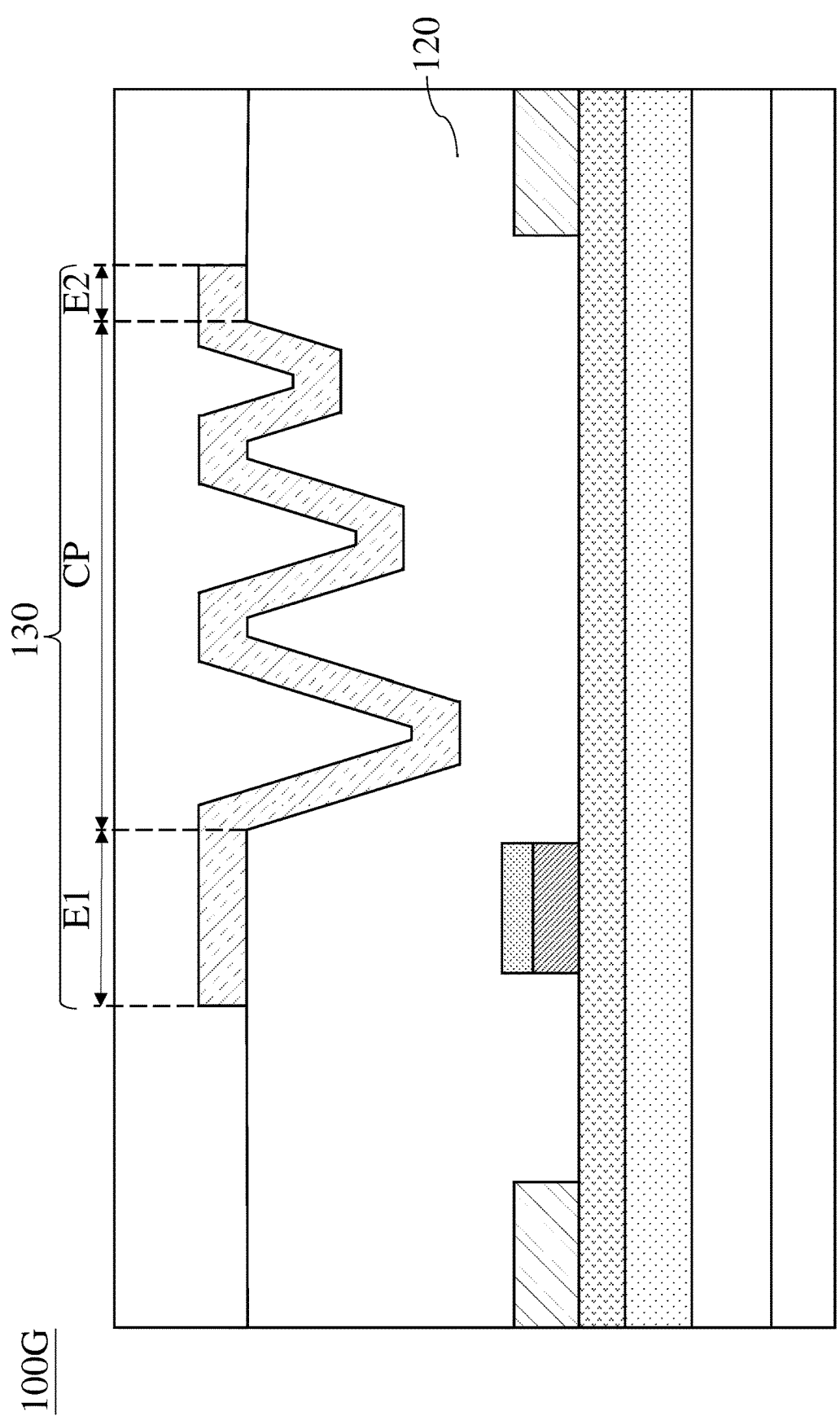
FIG. 9 is a vertical cross-sectional view of a III-nitride-based semiconductor device according to some embodiments of the present disclosure.

FIG. 9 is a vertical cross-sectional view of a semiconductor device 100G according to some embodiments of the present disclosure. In the exemplary illustration of FIG. 9, the central part CP extends obliquely downward, obliquely upward and laterally. Explained in another way, the whole profile of the central part CP can be viewed as a combination of the V-shaped profiles with different depths. The manufacturing process for the semiconductor device 100G can be similar to that of the semiconductor device 100A. During the etching stage of the passivation 120, recipes can be tuned such as temperature, pressure, or strength, so that the recesses in the passivation 120 have at least one oblique sidewall.

It should be noted that the above semiconductor devices can be manufactured by the afore-mentioned different processes in order to meet different electrical requirements.

Based on above, in the present disclosure, the field plate of the semiconductor device is a single field plate design, the recesses with different depths can be transferred to the passivation layer with an aid of a halftone photomask or a gray tone photomask one-time, such that manufacturing process of the single field plate can be simplified. Therefore, the semiconductor devices of the present disclosure can have a low manufacturing costs and a low manufacturing complexity. In addition, the probability of generating alignment errors can be reduced, thereby improving the electrical characteristics of the semiconductor device.

On the other hand, one of end part of the single field plate extends laterally and along a direction toward the source electrode from the gate electrode in a length greater than a width of the gate electrode, such that the single field plate can extend to a region between the source electrode from the gate electrode. Another end part of the single field plat extends laterally and along a direction toward the drain electrode from the gate electrode. Such configuration can reshape the electrical field between the source and the gate electrodes and the electrical field between the drain and the gate electrodes.

In addition, a central part of the single field plate at least has a flat portion, and the flat portion extends laterally in a region as the same the level of height as the end parts. The design of the flat portion provides an environmentally friendly choice for the formation of the subsequent element such as the conductive via. In summary, the semiconductor devices of the present disclosure can have lower manufacturing costs and maintain good electrical properties.

The embodiments were chosen and described in order to best explain the principles of the invention and its practical application, thereby enabling others skilled in the art to understand the invention for various embodiments and with various modifications that are suited to the particular use contemplated.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 within 30 within 20 within 10 or within 1 µm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. Further, it is understood that actual devices and layers may deviate from the rectangular layer depictions of the FIGS. and may include angles surfaces or edges, rounded corners, etc. due to manufacturing processes such as conformal deposition, etching, etc. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. A nitride-based semiconductor device, comprising:
a first nitride-based semiconductor layer;
a second nitride-based semiconductor layer disposed on the first nitride-based semiconductor layer and having a bandgap greater than a bandgap of the first nitride-based semiconductor layer;
a source electrode and a drain electrode disposed above the second nitride-based semiconductor layer;
a gate electrode disposed above the second nitride-based semiconductor layer and between the source and drain electrodes; and
a single field plate disposed over the gate electrode and extending toward the drain electrode, wherein the field plate has a first end part and a second end part which are opposite each other and located at substantially the same height with respect to the second nitride-based semiconductor layer and a central part between the first and second end parts, portions of the central part are in a position lower than that of the first and second end parts, and the first end part extends laterally in a length greater than a width of the gate electrode.

2. The semiconductor device of claim 1, wherein the first end part is located directly over the gate electrode.

3. The semiconductor device of claim 2, wherein the first end part extends laterally from a region between the source electrode and the gate electrode into a region between the gate electrode and the drain electrode.

4. The semiconductor device of claim 1, wherein the central part extends laterally at different levels of height lower than first and second end parts.

5. The semiconductor device of claim 1, wherein the first and second end parts are located at a first level of height with respect to the second nitride-based semiconductor layer, and the central part extending downward from the first level of height to a second level of height with respect to the second nitride-based semiconductor layer.

6. The semiconductor device of claim 1, wherein the central part extends upward from the second level of height to the first level of height with respect to the second nitride-based semiconductor layer.

7. The semiconductor device of claim 5, wherein the first and second end ends are located at a first level of height with respect to the second nitride-based semiconductor layer, and the central part comprises: a first portion extending upward from a second level height to the first level of height with respect to the second nitride-based semiconductor layer; a second portion extending upward from a third level of height to the first level of height with respect to the second nitride-based semiconductor layer, wherein the third level of height is greater than the second level of height with respect to the second nitride-based semiconductor layer.

8. The semiconductor device of claim 7, wherein the central part further comprises:
a third portion extending laterally at the first level of height with respect to the second nitride-based semiconductor layer and connecting to the first and second portions.

9. The semiconductor device of claim 5, wherein the central part extends upward from the second level of height to a third level of height with respect to the second nitride-based semiconductor layer, and the third level of height is less than the first level of height with respect to the second nitride-based semiconductor layer.

10. The semiconductor device of claim 1, wherein the central part extends laterally and upward to constitute a stepwise profile.

11. The semiconductor device of claim 1, wherein a distance from the second nitride-based semiconductor layer to the central part at least incrementally increases with extending along a direction pointing toward the drain electrode from the gate electrode.

12. The semiconductor device of claim 1, further comprising:
a dielectric layer disposed above the second nitride-based semiconductor layer and covering the gate electrode, the source electrode, and the drain electrode, wherein the first and second end parts of the field plate extend laterally on the dielectric layer.

13. The semiconductor device of claim 1, further comprising:
a first dielectric layer disposed above the second nitride-based semiconductor layer and covering the gate electrode, the source electrode, and the drain electrode; and a second dielectric layer disposed above the first dielectric layer and the field plate, wherein the field plate extends to form a recessed portion wrapping the second dielectric layer.

14. The semiconductor device of claim 1, wherein the central part is located within a region between the gate electrode and the drain electrode.

15. The semiconductor device of claim 1, wherein the first end part is separated from the source electrode.

16. A method for manufacturing a semiconductor device, comprising:
    forming a first nitride-based semiconductor layer disposed over a substrate;
    forming a second nitride-based semiconductor layer on the first nitride-based semiconductor layer;
    forming a source electrode and a drain electrode over the second nitride-based semiconductor layer;
    forming a gate electrode over the second nitride-based semiconductor layer and between the source and drain electrodes;
    forming a first dielectric layer above the second nitride-based semiconductor layer and covering the gate electrode, the source electrode, and the drain electrode;
    forming recesses in the first dielectric layer with different depths; and
    forming a single field plate on the dielectric layer and in the recesses.

17. The method of claim 16, further comprising:
    forming a second dielectric layer covering the single field plate.

18. The method of claim 16, further comprising:
    forming a mask layer on the first dielectric layer;
    forming at least one recess pattern in the mask layer; and
    transferring the recess pattern to the first dielectric layer so as to form the recesses.

19. The method of claim 18, wherein forming the recess pattern in the mask layer is performed by using a halftone mask or a gray tone mask.

20. The method of claim 18, further comprising:
    removing the mask layer after the formation of the recesses.

* * * * *